United States Patent [19]
David et al.

[11] Patent Number: 5,453,691
[45] Date of Patent: Sep. 26, 1995

[54] MINIATURIZED SQUID MODULE HAVING AN INTERMEDATE SUPER CONDUCTING SUPPORT FOR CONNECTING SQUID INPUT TERMINALS TO GRADIOMETER WIRES

[75] Inventors: Bernd R. David, Hüttblek; Olaf H. Dössel, Tangstedt; Wilfried Edeler, Hamburg; Wolfgang Hoppe, Norderstedt; Rolf U. D. Kobs, Tornesch; Johann E. W. Krüger, Quickborn; Kai-Michael Lüdeke, Hamburg; Gert Rabe, Pinneberg, all of Germany

[73] Assignee: U.S. Philips Corporation, New York, N.Y.

[21] Appl. No.: 110,030

[22] Filed: Aug. 20, 1993

[30] Foreign Application Priority Data

Aug. 22, 1992 [DE] Germany .......................... 42 27 877.5

[51] Int. Cl.$^6$ ................................................ G01R 33/035
[52] U.S. Cl. ......................... 324/248; 324/262; 505/846
[58] Field of Search ............................ 324/248, 260–263, 324/244; 307/306; 336/84 R, 84 M, 84 C; 505/846

[56] References Cited

U.S. PATENT DOCUMENTS

| | | | |
|---|---|---|---|
| 4,320,341 | 3/1982 | Lutes | 324/248 |
| 4,491,795 | 1/1985 | Gelinas | 324/248 |
| 4,591,787 | 5/1986 | Hoenig | 324/248 |
| 4,733,180 | 3/1988 | Hoenig et al. | 324/248 |
| 4,749,946 | 6/1988 | Hoenig | 324/248 |
| 5,166,614 | 11/1992 | Yokosawa et al. | 324/248 |
| 5,173,660 | 12/1992 | Marsden | 324/248 |
| 5,283,523 | 2/1994 | Uhl et al. | 324/248 |

FOREIGN PATENT DOCUMENTS 0200956 12/1986 European Pat. Off. .
0399499 11/1990 European Pat. Off. .

OTHER PUBLICATIONS

"The Design of a System of Adjustable Superconducting Plates for Balancing a Gradiometer" J. A. Overweg et al, Cryogenics, pp. 529–534, Sept. 1978.
"On the Squid—Modules for the UT Multichannel Neuromagnetometer" Terbrake et al, IC Squid 91, pp. 521–524, no month 1992.
"Multichannel DC Squid Sensor Array for Biomagnetic Applications" Hoenig et al, IEEE Trans. Magn. 17, pp. 2777–2785, Mar. 1991.
"Large–Area Low–Noise Seven–Channel DC Squid Magnetometer for Brain Research"Knuutila et al, Rev. Sci. Instrum. 58, pp. 2145–2156, Nov. 1987.
"Integrated Thin–Film DC Squid Sensors" M. B. Ketchen, IEEE Trans. Magn. Mag 23, pp. 1650–1657, Mar. 1987.
"Hybrid DC Squids Containing All Refractory Thin Film Josephson Junctions" Flemming et al, IEEE Trans. Magn, Mag 21, pp. 658–659, Mar. 1985.

Primary Examiner—Sandra L. O'Shea
Assistant Examiner—Warren S. Edmonds
Attorney, Agent, or Firm—Jack D. Slobod

[57] ABSTRACT

A miniaturized SQUID module (10), notably for multichannel magnetometers, for measurement of varying magnetic fields in a field strength range below $10^{-10}$ T, includes superconducting and shielded connections between a SQUID chip (19) and a gradiometer (12). The module can be mounted in the lower part of a cryostat and enables a large number of measurement points per unit of surface area. The SQUID chip (19) is arranged on a fully shielded supporting plate (18) which has a width of only a few millimeters and which is provided with electronic circuitry (23), the SQUID chip (19) being connected in a superconducting manner, at least by soldering, to the wires (11) of the gradiometer (12) via a superconducting, solderable and bondable intermediate support (27).

12 Claims, 2 Drawing Sheets

MINIATURIZED SQUID MODULE HAVING AN INTERMEDATE SUPER CONDUCTING SUPPORT FOR CONNECTING SQUID INPUT TERMINALS TO GRADIOMETER WIRES

BACKGROUND OF THE INVENTION

1. Field of the Invention

The invention relates to a miniaturized SQUID module, notably for multi-channel magnetometers, for measurement of varying magnetic fields in a field strength range below $10^{-10}$ T, comprising superconducting and shielded connections between a SQUID chip and a gradiometer.

2. Description of the Related Art

Multi-channel magnetometers are used, for example for function diagnosis of the human brain and heart in order to reproduce the neuro-electric currents. To this end, the small magnetic fields generated by the currents are measured outside the body. These magnetic fields can be as small as 100 fT ($100 \times 10^{-10}$ T) and can be measured only by means of superconducting components, i.e. SQUIDs (Superconducting Quantum Interference Devices). Customarily, the fields to be measured are picked up by means of so-called gradiometers which are sensitive only to field gradients, but not to uniform fields. Interference signals from remote sources can thus be suppressed. The suppression factor of such gradiometers for disturbing uniform fields, should be smaller than $10^{-4}$. Via twisted superconducting wires, the signal to be measured is applied from the gradiometers to the SQUID so as to be coupled in inductively by means of a coil. Because the SQUID should not respond directly to external magnetic fields but should measure the signals arriving from the gradiometer, the SQUID customarily operates within a superconducting magnetic field shield.

Magnetometer devices of this kind are known, for example from the literature stated below and from EP-A1-0 200 956. The latter document relates to a comparatively complex device for measuring weak magnetic fields, utilizing a plurality of superconducting connections between a SQUID array, arranged on a substrate provided with contact pads, and a gradiometer array which comprises inter alia a rather complex mechanical contact comb for the superconducting connections.

An accurate analysis has revealed that the prior-art superconducting magnetic field shielding itself distorts uniform magnetic fields because of its field displacement, and hence leads to apparent field balancing of the gradiometer even when the gradiometer itself has been optimally balanced by high precision manufacture.

In order to estimate the order of magnitude of the field distortion caused by superconducting SQUID shields, the field balance E can be calculated for a first-order gradiometer having a radius r, caused by a superconducting disc having a radius a which is situated at a distance $z_1$ and a distance $z_2$ from the upper turn and the lower turn, respectively, of the gradiometer. According to an article by "J.A. Overweg, M.J. Walter-Peters", Cryogenics, 529 (1978), there is obtained $$E = \frac{2}{\pi} \left\{ \frac{v(z_2,a)}{v^2(v_2,a)+1} + \right.$$

-continued $$\left. a\tan(v(z_2,a)) - \frac{v(z_1,a)}{v^2(z_1,a)+1} - a\tan(v(z_1,a)) \right\}$$

where $$v(z,a) = \frac{\sqrt{z^2+r^2-a^2+\sqrt{(z^2+r^2-a^2)^2+4 \cdot a^2 \cdot z^2}}}{a \cdot \sqrt{2}}$$

By way of example, the field balancing of a superconducting disc having a diameter of 5 mm or 10 mm can be calculated for different distances from a first-order gradiometer having a diameter of 20 mm and a basic length of 50 mm. The result is that a SQUID housing having a diameter of 10 mm should be situated at least 75 mm from the gradiometer in order to ensure that the apparent balancing error remains smaller than $10^{-4}$. These geometrical relationships, however, have substantial drawbacks in view of the required cooling in a cryostat and the arrangement of a plurality of SQUID modules in a multi-channel magnetometer.

Using a formula from the article by "H.J.M. Terbrake et at", IC SQUID 91, pp. 521–524, (1991), laterally offset SQUID shields in a multi-channel system can also be taken into account. For example, for a 19-channel system with a channel spacing of 25 mm it is found that the SQUID modules must be situated at least 150 mm from the gradiometers in the case of a diameter of 10 mm. Thus, these geometrical relationships are even worse in multi-channel magnetometers, ultimately having an adverse effect also on the feasible number of measuring points per unit of surface area.

The SQUID modules also known from articles by "H.E. Hoening et at", IEEE Trans. Magn. MAG17, 2777 (1991), "J. Knuutila et at", Rev. Sci. Instrum. 58, 2145 (1987), "M.B. Ketchen", IEEE Trans. Magn., MAG23, 1650 (1987) and "D.L. Fleming", IEEE Trans. Magn. MAG21, 658 (1985) are of this order of magnitude or are partly even less attractive, because they involve partly a complex SQUID chip assembly, a complex connection of the superconducting wires, a large vessel for superconducting shielding, an unattractive arrangement for connection of the cables to the SQUID electronics, or a large transformer for impedance matching.

SUMMARY OF THE INVENTION

It is an object of the present invention to provide a miniaturized SQUID module, notably for multi-channel magnetometers, which can be mounted substantially completely within the lower part of a cryostat and which enables a large number of measuring points per unit of surface area.

This object is achieved in accordance with the invention in that the SQUID chip is provided on a fully shielded supporting plate which has a width of only a few millimetres and which is provided with electronic circuitry, the SQUID chip being connected in a superconducting manner, via a superconducting, solderable and bondable intermediate support, to the wires of the gradiometer at least by soldering.

On the basis of the above formula for a single SQUID module, the proportions of the SQUID module can be estimated for a predetermined distance between the SQUID module and the gradiometer. The SQUID module can thus be moved to within 40 mm from the gradiometer, provided that it is possible to accommodate the SQUID or the SQUID chip in a housing having a diameter of only 5 mm.

For a multi-channel system, in conformity with the above calculation, a distance of 85 mm between the SQUID module and the gradiometer would already suffice for a housing diameter of 5 mm. This distance is substantially smaller than the feasible distance in the prior-art devices. An as small as possible distance is particularly attractive, because the superconducting measurement system can then be accommodated completely in the bottom zone of, for example a helium cryostat, so that the time intervals between the refilling with helium can also be prolonged. Because such a SQUID module in accordance with the invention also has a substantially smaller diameter than the prior-art SQUID module, also a multi-channel magnetometer comprising a substantially larger number of measurement points per unit surface area is possible.

In order to achieve the relevant dimensions, in accordance with the invention the SQUID chip is glued and bonded to a supporting plate of, for example ceramic, which is narrower than approximately 4 mm. The tracks, resistances or electronic components required for the electric circuitry of the SQUID are printed, for example using advantageously the thick-film technique, directly onto the ceramic support. In a first embodiment of the invention, the superconducting connections required for coupling in the signals from the gradiometer are established by soldering. To this end, small strips of, for example a PbInAu alloy which has proven to be particularly stable in respect of its superconducting properties, is soldered on the one side to the SQUID chip and on the other side to a soldering pad on the ceramic support. The superconducting wires from the gradiometer are then soldered to the corresponding soldering pads on the ceramic support.

In a further attractive embodiment of the superconducting connection to the gradiometer, the narrow strips of, for example PbInAu alloy, can be glued onto the ceramic support. The connection to the SQUID chip is then realised by bonding ductile niobium wire directly to the PbInAu strips, the connection to the gradiometer being established by soldering the superconducting wires to the other end of the PbInAu strip. This type of superconducting coupling attractively combines a microscopic connection technology (bonding) at the side of the SQUID chip with a macroscopic connection technology (soldering) at the side of the gradiometer.

In a further attractive embodiment of the invention, the PbInAu strip can be replaced by any other intermediate support, provided that the latter is superconducting, solderable and bondable, for example a niobium strip or a silicon chip covered with niobium and appropriately arranged on the supporting plate.

In a further embodiment of the invention, the supporting plate with the SQUID chip is arranged in a superconducting tube of, for example niobium which, in view of the above steps in accordance with the invention, has an outer diameter of only approximately 5 mm, its inner side being electrically insulated, for example by means of a Kapton foil.

In a further embodiment of the invention, the bottom of the tube can be sealed by means of a lid of, for example niobium. Surprisingly, however, it has been found that the shielding from external magnetic fields is also adequate in the absence of a lid, provided that the SQUID is arranged transversely of the robe in accordance with the invention and that the robe length exceeds approximately 30 mm.

In a further embodiment of the invention, the supporting plate can be pressed against the inner wall of the superconducting tube by springs, for example made of spring bronze, in order to prevent vibrations. Additionally, the supply wires themselves may also be constructed as springs.

In a further embodiment of the invention, the connection to the normally conductive connection leads connected to the SQUID electronics can be established either directly on the supporting plate or via an intermediate support which may be accommodated in a small, normally conductive sleeve assembled with the tube.

Surprisingly, it has also been found that the transformer customarily arranged within the cryostat for impedance matching can be omitted, i.e. replaced by a single transformer at room temperature at the input of the SQUID electronics, when the steepness of the SQUID characteristic exceeds the value of approximately 30 $\mu V/\Phi_0$. Because the present SQUID definitely reaches this value, the construction of the SQUID module in accordance with the invention can also be substantially simpler and smaller than in the prior art.

BRIEF DESCRIPTION OF THE DRAWING

Embodiments of the invention will be described in detail hereinafter with reference to a drawing. Therein.

DETAILED DESCRIPTION OF THE PREFERRED EMBODIMENTS

Figure 1:
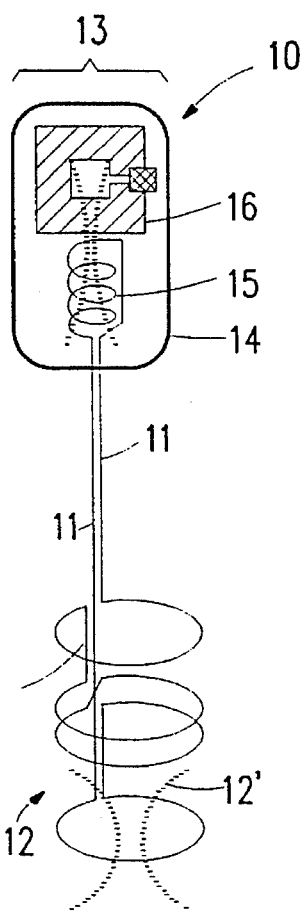
FIG. 1 shows a SQUID module with a gradiometer connected thereto.

FIG. 1 shows diagrammatically the internal construction of a SQUID module 10 which is connected on the one side to connection leads leading to the environment and on the other side, via superconducting wires 11, to a gradiometer 12. As has already been stated, it is particularly advantageous when the distance between the SQUID module 10 and the gradiometer 12 is as small as possible and also when the outer diameter 13 of the SQUID module 10 is also as small as possible. The SQUID module 10 shown in FIG. 1 comprises a superconducting shield 14, a coupling-in coil 15 and a SQUID 16 which are shown diagrammatically in order to illustrate the cooperation of the individual components. The magnetic field to be measured is denoted by the reference numeral 12'.

Figure 2:
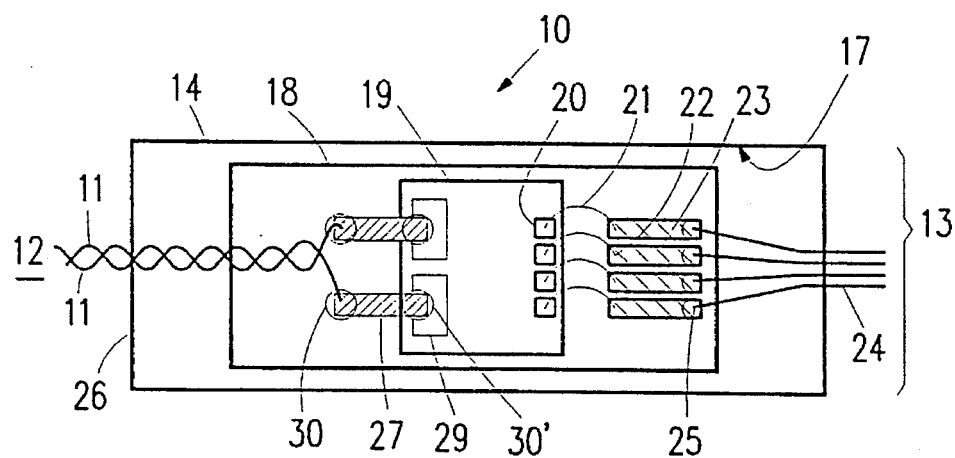
FIG. 2 shows a SQUID module in accordance with the invention with soldered superconducting connections.

FIG. 2 shows a miniaturized SQUID module 10 in accordance with the invention which has been rotated through 90° relative to FIG. 1 and whose superconducting shield is formed by a tube 14 which is preferably made of niobium. In accordance with the invention, the tube 14 has an outer diameter 13 of only 5 mm. The inner side of the tube 14 is electrically insulated, for example by means of a foil 17 (not shown) of Kapton. Inside the robe 14 there is arranged a supporting plate 18 which is preferably made of ceramic and whose width is smaller than approximately 4 mm, so that it can be readily slid into the robe 14 in which it is secured by means of springs (not shown) of, for example bronze which press the supporting plate 18 against the inner wall of the tube 14. This attachment at the same time serves to prevent vibrations. In addition, the supply wires can also be constructed as springs, or in any case as resilient wires.

On the ceramic supporting plate 18 there is arranged a SQUID chip 19 which contains the actual SQUID. Terminals 20 of the SQUID chip 19 are connected, via bonding wires 21, to corresponding connections 22 of an electronic circuit 23, possibly consisting per channel of tracks and electronic components, which is provided directly on the supporting plate by a thick-film technique. At an area 25 the electronic circuitry 23 is soldered, for example to connection wires 24 to the environment. The emanating connection wires 24, however, can also be connected to the electronic circuitry 23 via an intermediate support (not shown) which may be arranged within a small, normally conductive sleeve assembled with the tube 14. In accordance with the invention, because of the steepness of the SQUID characteristic a transformer customarily arranged within the cryostat for impedance matching can be dispensed with and be replaced by a single room-temperature transformer (not shown) at the input of the SQUID electronic circuitry.

The tube 14 can be closed by means of a lid 26, for example consisting of niobium, at its (bottom) side which faces the gradiometer 12. However, if the robe 14 is longer than approximately 30 mm and the SQUID is arranged transversely of the tube, a lid can be dispensed with because the shielding from external magnetic fields is adequate also in the absence of a lid.

The SQUID chip 19 is connected in a superconducting manner at least by soldering, to the wires 11 of the gradiometer, via a superconducting, solderable intermediate support 27 in the form of a strip. The strips 27 are preferably made of a PbInAu alloy or niobium. The strips 27 are connected to the corresponding terminals 29 of the SQUID chip 19 by soldering at a soldering area 30'. On their other end the strips 27 are soldered in a superconducting manner to a solder pad 30 on the supporting plate 18, respective wires 11 of the gradiometer also being soldered thereto.

Figure 3:
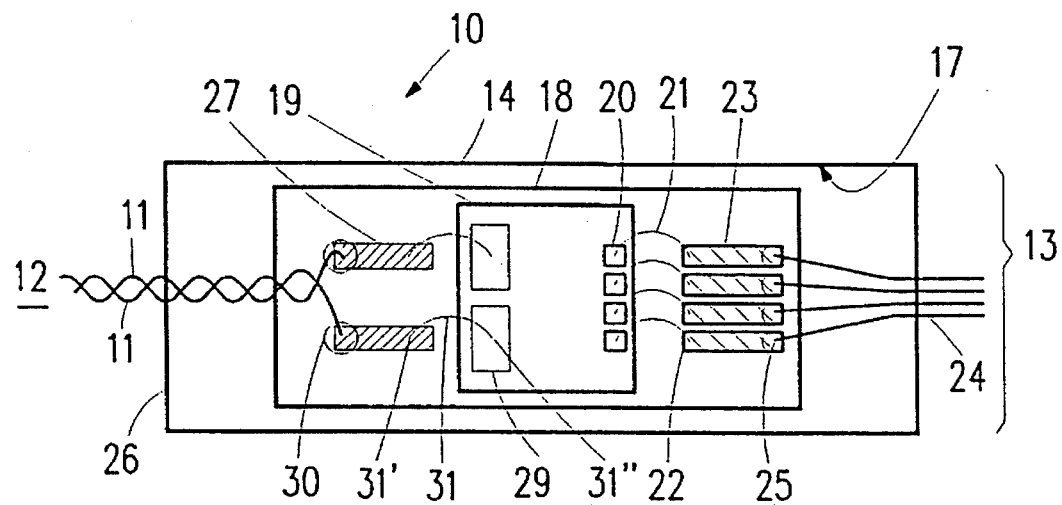
FIG. 3 shows a SQUID module in accordance with the invention with partly soldered superconducting connections.

FIG. 3 shows a further embodiment of the SQUID module 10 in accordance with the invention which is constructed as described with reference to FIG. 1, with the exception of the superconducting connection of the SQUID chip 19 to the wires 11. As is shown in this Figure, in this embodiment the strips 27 are provided directly on the supporting plate 18 and soldered to the wires 11 via solder pads 30 as before. The connection to the SQUID chip, however, is realised via bonding wires 31 which preferably consist of ductile niobium wire. These wires 31 are thus bonded to the strips 27 on the one side and to the corresponding terminals 29 of the SQUID chip 19 on the other side, i.e. at the points 31' and 31".

Figure 4:
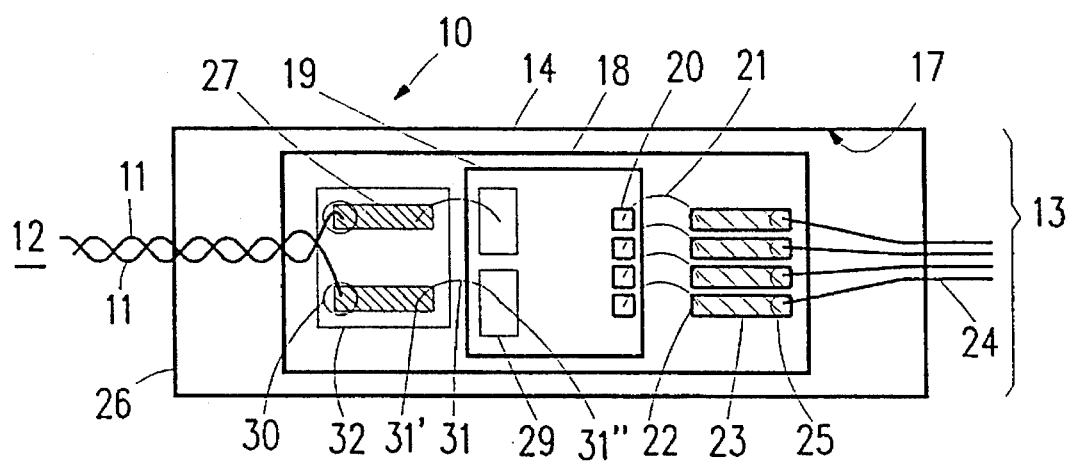
FIG. 4 shows a SQUID module in accordance with the invention, corresponding to FIG. 3, utilizing a coated connection chip.

FIG. 4 shows a further embodiment of the superconducting connection between the SQUID chip 19 and the wires 11 of the gradiometer 12. The description of the other parts of the SQUID module 10 shown in FIG. 4 corresponds to the description given with reference to FIG. 1. As appears from this Figure, in this further embodiment of the invention there is also provided an intermediate support quasi in the form of strips 27, soldered on the one side, via a solder pad 30, to a wire 11 and on the other side, at the area 31', via a bonding wire 31, to the corresponding terminals 29, at the area 31", of the SQUID chip 19. In this embodiment, however, the strips 27 are formed as a layer of niobium on a silicon chip 32 which itself is permanently connected to the supporting plate 18, for example by gluing.

The connection possibilities mentioned with reference to the FIGS. 3 and 4 attractively combine the microscopic connection technology of bonding at the side of the SQUID chip 19 and the macroscopic connection technology of soldering at the side of the gradiometer. As a result of the steps proposed in accordance with the invention, the construction of the SQUID module 10 may be substantially simpler and smaller than in the prior art, thus offering the described advantages.

The characteristics of the invention as disclosed in the above description, in the FIGS. 1, 2, 3 and 4 as well as in the claims may be of essential importance, both separately and in arbitrary combinations, for implementing the various embodiments of the invention.

We claim:

1. A miniaturized SQUID module for multi-channel magnetometers for measurement of varying magnetic fields in a field strength range below $10^{-10}$ T, comprising superconducting and shielding connections between a SQUID chip and a gradiometer, said SQUID module comprising: a fully shielded supporting plate (18) carrying the SQUID chip (19), the supporting plate having a width of only a few millimeters and being provided with electronic circuitry (23) connected to the SQUID chip, and a superconducting, solderable and bondable intermediate support (27), the SQUID chip (19) being connected in a superconducting manner to the intermediate support (27), and having the wires (11) of the gradiometer (12) being also connected in a superconducting manner to the intermediate support at least by soldering, wherein the intermediate support is provided in the form of narrow strips (27) Of a PbInAu alloy or of niobium, which strips are connected in a superconducting manner on one side of the supporting plate to terminals (29) of the SQUID chip (19) and on the other side of the supporting plate to respective soldering pad (30) of the supporting plate (18) whereto there is also connected a respective wire (11) of the gradiometer (12).

2. A SQUID module as claimed in claim 1, characterized in that the connections of the narrow strips (27) to the terminals (29) of the SQUID chip (19) are realised by soldering to soldering pads (31').

3. A SQUID module as claimed in claim 1, characterized in that the connection of the narrow strips (27) to the terminals (29) of the SQUID chip (19) is realized via a superconducting bonding wire (31) of ductile niobium, the strips (27) being rigidly connected to the supporting plate (18), for example by gluing.

4. A SQUID module as claimed in claim 3, characterized in that the narrow strips (27) are formed as strips which are covered with a niobium layer and which are provided on a silicon chip (32) arranged on the supporting plate (18).

5. A SQUID module as claimed in claim 1, characterized in that the electronic circuitry (23), which comprises conductor tracks and electronic components, is provided directly on the supporting plate (18) by way of a thick-film technique and is connected on one side of the supporting plate, via bonding wires (21), to the corresponding terminals (20) of the SQUID chip (19) and on the other side of the supporting plate, via solder pads (25), to connection wires (24) leading to the environment.

6. A SQUID module as claimed in claim 5, characterized in that the supporting plate (18) is made of ceramic and is narrower than approximately 4 mm, the SQUID chip (19) being glued and bonded to the supporting plate (18).

7. A SQUID module as claimed in claim 6, characterized in that the supporting plate (18) with the SQUID chip (19) is arranged within a superconducting tube (14) for the purpose of shielding, the inner side of said tube being electrically insulated by means of a foil (17).

8. A SQUID module as claimed in claim 7, characterized in that the tube (14) has an outer diameter (13) which is not greater than approximately 5 mm and consists of niobium, the foil (17) consisting of Kapton.

9. A SQUID module as claimed in claim 8, characterized in that the bottom of the tube (14) is closed by means of a lid (26) consisting of niobium.

10. A SQUID module as claimed in claim 8, characterized in that the SQUID chip (19) is arranged transversely of the tube (14), the tube (14) having a length greater than approximately 30 mm.

11. A SQUID module as claimed in claim 9, characterized in that the supporting plate (18) is pressed against the wall of the robe (14) by springs, the wires being constructed so as to be resilient in order to prevent vibrations and the springs being made of bronze.

12. A SQUID module as claimed in claim 7, characterized in that the connection wires (24) leading to the environment are connected to the electronic circuitry (23) via an intermediate support, the intermediate support being accommodated in a small, normally conductive sleeve assembled with the tube (14).

* * * * *